United States Patent [19]

Park

[11] Patent Number: 5,760,498
[45] Date of Patent: Jun. 2, 1998

[54] POWER DRAWING CIRCUIT FOR TWO-WIRE SWITCHING UNIT

[75] Inventor: Jong Kuk Park, Seoul, Rep. of Korea

[73] Assignee: Anam Industrial Co., Ltd., Seoul, Rep. of Korea

[21] Appl. No.: 693,362

[22] Filed: Aug. 6, 1996

[51] Int. Cl.[6] ............................................. H01H 47/00
[52] U.S. Cl. ........................ 307/126; 307/112; 307/125; 327/446; 327/438
[58] Field of Search ............................ 307/112, 116, 307/125, 126, 64, 66, 85, 86, 87; 327/419, 438, 445, 446, 452, 476

[56] References Cited

U.S. PATENT DOCUMENTS

| | | |
|---|---|---|
| 4,731,548 | 3/1988 | Ingraham ............................ 307/116 |
| 4,803,418 | 2/1989 | Ritchie ............................... 323/324 |
| 5,579,192 | 11/1996 | Lee ..................................... 361/18 |

*Primary Examiner*—William M. Shoop, Jr.
*Assistant Examiner*—Jonathan S. Kaplan
*Attorney, Agent, or Firm*—Abelman, Frayne & Schwab

[57] ABSTRACT

A power drawing circuit for a two-wire switching unit, the two-wire switching unit including a switching control circuit having its positive voltage input terminal connected in series to a load, the load being connected to one side of a power source. The power drawing circuit comprises a voltage drawing part for drawing a voltage to be supplied to the switching control circuit when the switching unit is turned on, the voltage drawing part having its one side connected to the positive voltage input terminal of the switching control circuit and its other side connected to a negative voltage input terminal of the switching control circuit, a triac having its one side connected to the other side of the voltage drawing part, its other side connected to the other side of the power source and its gate connected to a control terminal of the switching control circuit, and a diode connected in parallel to the power drawing part for passing a reverse current, the diode having its anode connected to the negative voltage input terminal of the switching control circuit and its cathode connected to the positive voltage input terminal of the switching control circuit. The power drawing circuit is not restricted by the types of load. Also, the power drawing circuit is well adaptive even to reactance loads and simple in construction.

1 Claim, 2 Drawing Sheets

POWER DRAWING CIRCUIT FOR TWO-WIRE SWITCHING UNIT

BACKGROUND OF THE INVENTION

1. Field of the Invention

The present invention relates to a power drawing circuit used in a two-wire switching unit.

2. Description of the Prior Art

Generally, two-wire switching units are controlled in an electronic circuit manner and used in a television remote controller switch, a time switch, a delay switch, a sensor switch and a robbery alarm switch. Such a two-wire switching unit requires a power drawing circuit for supplying separate power to the switching unit to operate it under the condition that a switch is turned on to supply power to a load.

For the implementation of the power drawing circuit, there have conventionally been proposed methods employing a separate battery, a current transformer and a triac. The second method employing the current transformer is adapted to draw a voltage induced in a secondary coil of the current transformer when a load current flows through a primary coil of the current transformer. The third method employing the triac is adapted to control the phase of a load current in such a manner that a load can be turned on after it is turned off for a short time when a switch is turned on, and to use a voltage for the short OFF time.

However, the first method employing the separate battery has a disadvantage in that a separate space must be provided to accommodate the separate battery, resulting in an increase in size. Also in the first method, the separate battery must be replaced with a new one at regular intervals. This is inconvenient to the user. The second method employing the current transformer can not be generally used because voltages induced in the secondary coil of the current transformer are different according to the types of load. Also, the second method is of no practical use in that the volume is large and the price is high. Because the third method employing the triac controls the phase of the load current, it can be applied to resistance loads such as an incandescent lamp but not to reactance loads with coils such as a fluorescent lamp and a ventilation fan.

SUMMARY OF THE INVENTION

Therefore, the present invention has been made in view of the above problems, and it is an object of the present invention to provide a power drawing circuit for a two-wire switching unit which employs no phase control method so that it cannot be restricted by the types of load, and which is well adaptive even to reactance loads and simple in construction.

In accordance with the present invention, the above and other objects can be accomplished by a provision of a power drawing circuit for a two-wire switching unit, the two-wire switching unit including a switching control circuit having its positive voltage input terminal connected in series to a load, the load being connected to one side of a power source, comprising voltage drawing means for drawing a voltage to be supplied to the switching control circuit when the switching unit is turned on, the voltage drawing means having its one side connected to the positive voltage input terminal of the switching control circuit and its other side connected to a negative voltage input terminal of the switching control circuit; a triac having its one side connected to the other side of the voltage drawing means, its other side connected to the other side of the power source and its gate connected to a control terminal of the switching control circuit; and a diode connected in parallel to the power drawing means for passing a reverse current, the diode having its anode connected to the negative voltage input terminal of the switching control circuit and its cathode connected to the positive voltage input terminal of the switching control circuit.

The voltage drawing means includes a plurality of diodes connected in series between the positive and negative voltage input terminals of the switching control circuit.

Alternatively, the voltage drawing means includes a zener diode having its cathode connected to the positive voltage input terminal of the switching control circuit and its anode connected to the negative voltage input terminal of the switching control circuit.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
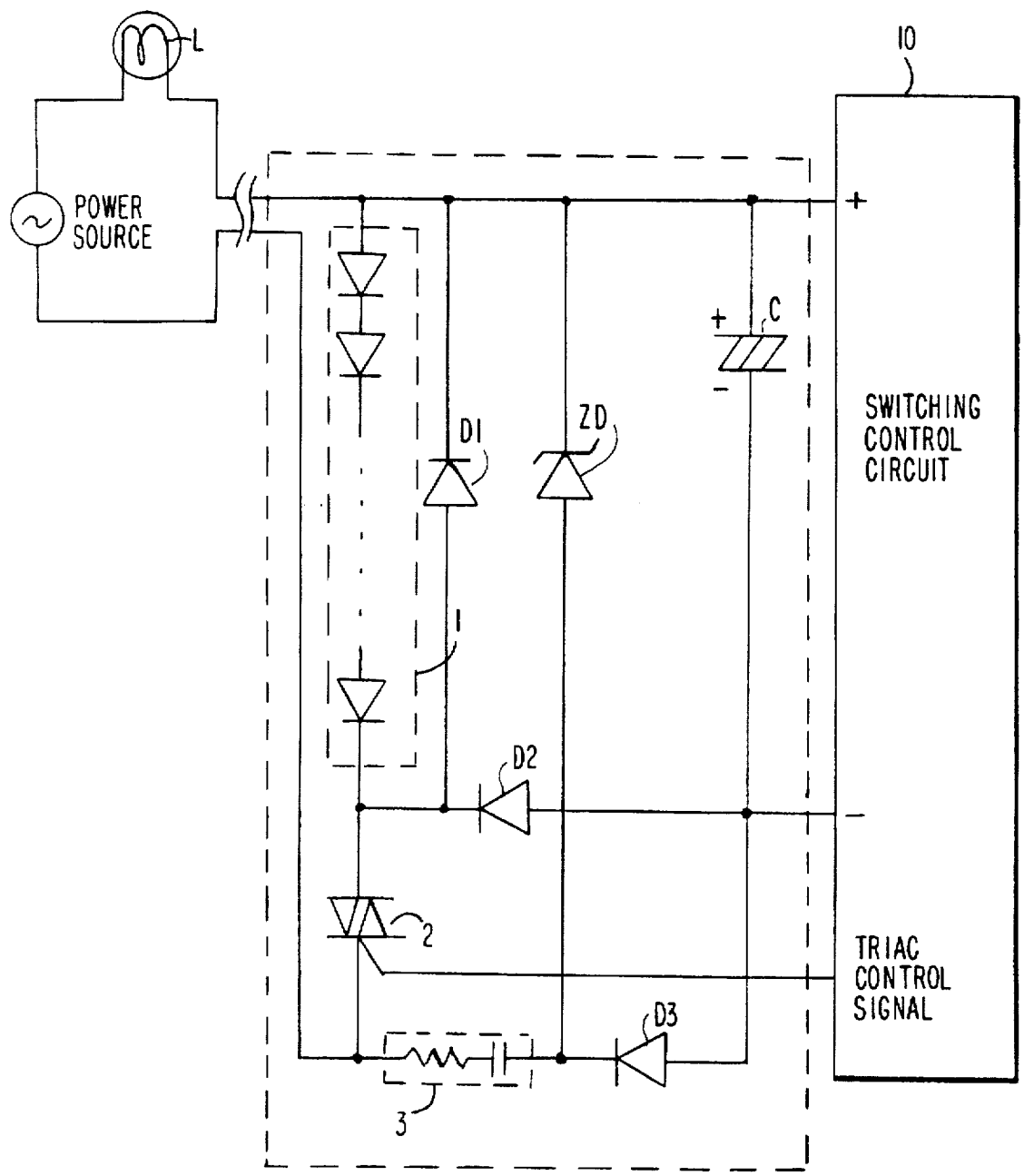
FIG. 1 is a circuit diagram illustrating the construction of a power drawing circuit for a two-wire switching unit in accordance with an embodiment of the present invention.

FIG. 1 is a circuit diagram illustrating the construction of a power drawing circuit for a two-wire switching unit in accordance with an embodiment of the present invention. As shown in this drawing, the two-wire switching unit comprises a switching control circuit 10 having its positive voltage input terminal (+) connected in series to a load L which is connected to one side of a power source.

The power drawing circuit comprises a voltage drawing part 1 for drawing a voltage to be supplied to the switching control circuit 10 when the switching unit is turned on. The voltage drawing part 1 has its one side connected to the positive voltage input terminal (+) of the switching control circuit 10 and its other side connected to a negative voltage input terminal (−) of the switching control circuit 10.

The power drawing circuit further comprises a triac 2 having its one side connected to the other side of the voltage drawing part 1, its other side connected to the other side of the power source and its gate connected to a control terminal of the switching control circuit 10, and a diode D1 connected in parallel to the voltage drawing part 1 for passing a, reverse current. The diode D1 has its anode connected to the negative voltage input terminal (−) of the switching control circuit 10 and its cathode connected to the positive voltage input terminal (+) of the switching control circuit 10.

The power drawing circuit further comprises an impedance part 3 having its one side connected to the other side of the power source. The impedance part 3 includes a resistor and a capacitor connected in series to the other side of the power source.

The power drawing circuit further comprises a zener diode ZD having its anode connected to the other side of the impedance part 3 and its cathode connected to the positive voltage input terminal (+) of the switching control circuit 10.

a smoothing capacitor C connected between the positive and negative voltage input terminals (+) and (−) of the switching control circuit 10, a diode D3 having its cathode connected to the other side of the impedance part 1 and its anode connected to the negative voltage input terminal (−) of the switching control circuit 10, and a diode D2 having its anode connected to the negative voltage input terminal (−) of the switching control circuit 10 and its cathode connected to the other side of the power drawing part 1.

The voltage drawing part 1 includes a plurality of diodes connected in series between the positive and negative voltage input terminals (+) and (−) of the switching control circuit 10. The diodes have their anodes sequentially connected to the positive voltage input terminal (+) of the switching control circuit 10.

The operation of the power drawing circuit with the above-mentioned construction in accordance with the embodiment of the present invention will hereinafter be described in detail.

First, under the condition that the switching unit is at its OFF state, namely, that no drive voltage is applied to the load L, the switching control circuit 10 outputs no control signal to the gate of the triac 2. As a result, the triac 2 is at its OFF state.

Thereafter, when an alternating current (referred to hereinafter as AC) voltage of positive half cycle is applied to the load L, current through the load L flows in turn through the zener diode ZD and the impedance part 3. A voltage across the zener diode ZD is divided by the smoothing capacitor C and the diode D3. As a result, a voltage obtained by subtracting a voltage (about 0.6V) across the diode D3 from the voltage across the zener diode ZD is charged on the smoothing capacitor C and in turn supplied to the switching control circuit 10.

At this time, the impedance part 3 has a value set to permit only the flow of such a current that cannot drive the load L.

Thereafter, when the AC voltage of positive half cycle is applied to the other side of the power source, current flows through the impedance part 3 and the zener diode ZD. At this time, the switching control circuit 10 is energized by the voltage charged on the smoothing capacitor C. As a result, a half-wave rectified voltage is supplied to the switching control circuit 10.

Under this condition, the switching control circuit 10 makes a triac control signal active in response to an external radio signal or on the basis of self-determination to turn on the switching unit. As a result, the triac 2 is turned on in response to the triac control signal from the switching control circuit 10.

In the case where the AC voltage of positive half cycle is applied to the load L under the condition that the triac 2 is turned on, current flows through the plurality of diodes in the voltage drawing part 1 and the triac 2. At this time, the applied AC voltage is dropped by withstand voltages of the plurality of diodes in the voltage drawing part 1. As a result, the dropped voltage is charged on the smoothing capacitor C and in turn supplied to the switching control circuit 10. Then, when an AC voltage of negative half cycle is applied to the load L, current flows through the triac 2 and the reverse current passing diode D1. At this time, the switching control circuit 10 is energized by the voltage charged on the smoothing capacitor C.

Therefore, the power drawing circuit can always supply power to the switching control circuit regardless of ON/OFF states of the load.

Figure 2:
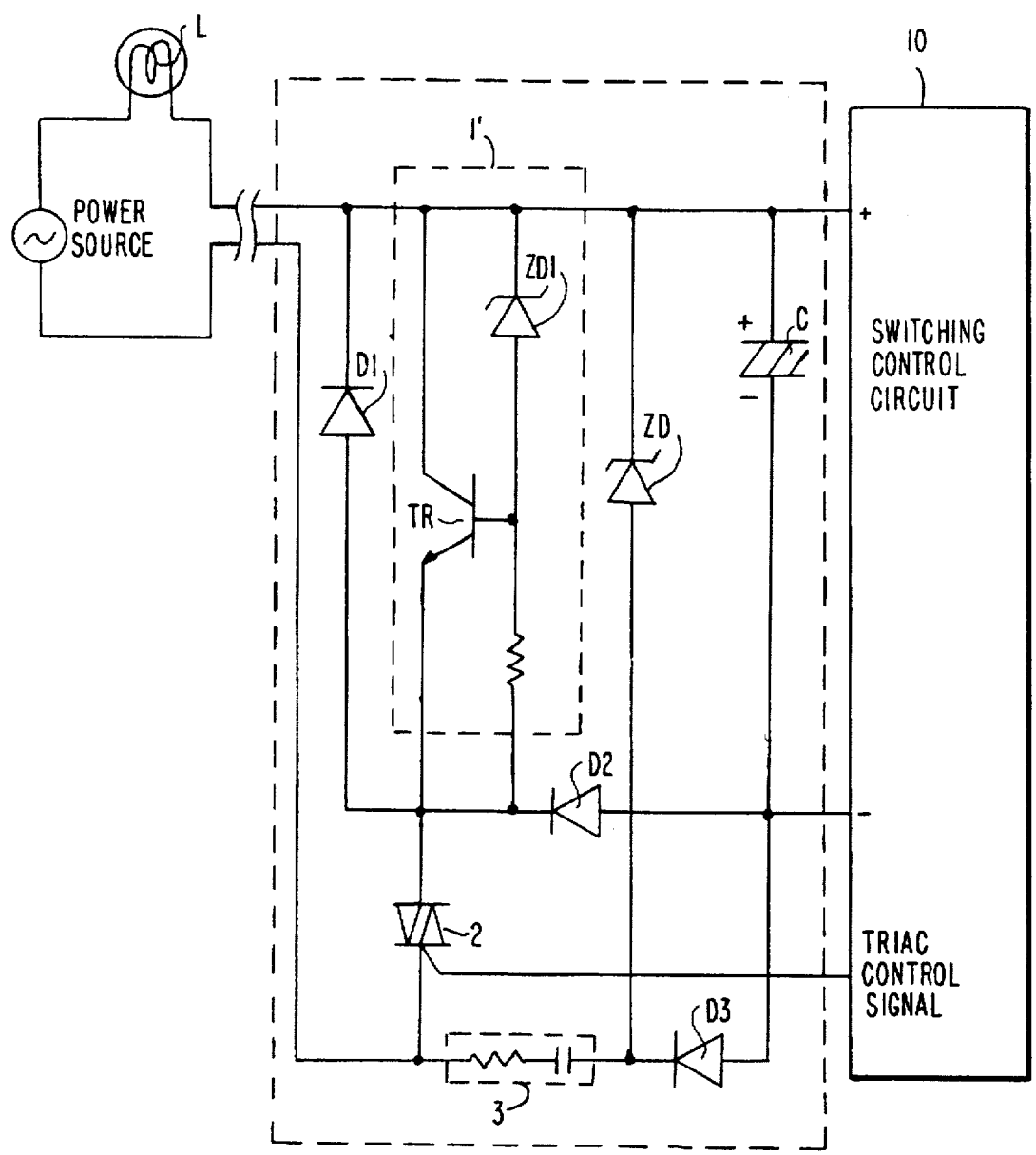
FIG. 2 is a circuit diagram illustrating the construction of a power drawing circuit for a two-wire switching unit in accordance with an alternative embodiment of the present invention.

FIG. 2 is a circuit diagram illustrating the construction of a power drawing circuit for a two-wire switching unit in accordance with an alternative embodiment of the present invention. As shown in this drawing, the construction of the second embodiment of the present invention is substantially the same as that of the first embodiment of the present invention, with the exception that a voltage drawing part 1' includes a transistor TR, a zener diode ZD1 and a resistor instead of the plurality of diodes. The transistor TR has its collector connected to the positive voltage input terminal (+) of the switching control circuit 10 and its emitter connected to the triac 2. The zener diode ZD1 has its cathode connected to the collector of the transistor TR and its anode connected to a base of the transistor TR. The resistor is connected between the base and emitter of the transistor TR.

The operation of the power drawing circuit with the above-mentioned construction in accordance with the alternative embodiment of the present invention will hereinafter be described in detail.

As stated previously, the voltage drawing part 1' is adapted to provide a voltage to the switching control circuit 10 when the switching unit is turned on. First, when an AC voltage of positive half cycle is applied to the positive voltage input terminal (+) of the switching control circuit 10 through the load L, current flows through the zener diode ZD1, the resistor connected to the base of the transistor TR and the triac 2, thereby causing a voltage to be applied across the zener diode ZD1 and resistor. As a result, the transistor TR is turned on. The voltage across the zener diode ZD1 and resistor is supplied as an operating voltage to the switching control circuit 10 because it is applied between the positive and negative voltage input terminals (+) and (−) of the switching control circuit 10. At this time, current corresponding to an excess of the voltage across the zener diode ZD1 flows through the transistor TR, thereby protecting the zener diode ZD1.

As apparent from the above description, according to the present invention, the power drawing circuit employs the diode voltage drop method. Therefore, as compared with the phase control method, the power drawing circuit of the present invention is not restricted by the types of load, so that it can be maximized in stability. Further, the power drawing circuit of the present invention can reduce the space occupancy as compared with the battery and current transformer employing methods.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power drawing circuit for a two-wire switching unit, said two-wire switching unit including a switching control circuit, said switching control circuit having a positive voltage input terminal connected in series to a load, said load being connected to one side of a power source, said power drawing circuit comprising:

voltage drawing means for drawing a voltage to be supplied to said switching control circuit when said switching unit is turned on, said voltage drawing means having one side connected to said positive voltage input terminal of said switching control circuit and the other side connected to a negative voltage input terminal of said switching control circuit;

a triac having one side connected to the other side of said voltage drawing means, the other side of said triac being connected to the other side of said power source, and a gate of said triac being connected to a control terminal of said switching control circuit;

a diode connected in parallel to said voltage drawing means for passing a reverse current, said diode having an anode connected to said negative voltage input terminal of said switching control circuit and a cathode connected to said positive voltage input terminal of said switching control circuit;

impedance means having one side connected to the other side of said power source;

a first zener diode having an anode connected to the other side of said impedance means and a cathode connected to said positive voltage input terminal of said switching control circuit; and a smoothing capacitor connected between said positive and negative voltage input terminals of said switching control circuit;

said voltage drawing means including:

a second zener diode having a cathode connected to said positive voltage input terminal of said switching control circuit and an anode connected to said negative voltage input terminal of said switching control circuit; and a transistor having a collector connected to said positive voltage input terminal of said switching control circuit, an emitter of said transistor being connected to said triac and a base of said transistor being connected to said anode of said second zener diode.

* * * * *